US010763863B2

United States Patent

Liaw

(12) United States Patent
(10) Patent No.: US 10,763,863 B2
(45) Date of Patent: Sep. 1, 2020

(54) SEMICONDUCTOR DEVICE FOR LOGIC AND MEMORY CO-OPTIMIZATION

(71) Applicant: Taiwan Semiconductor Manufacturing Co., Ltd., Hsinchu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/441,682

(22) Filed: Jun. 14, 2019

(65) Prior Publication Data

US 2020/0106441 A1 Apr. 2, 2020

Related U.S. Application Data

(60) Provisional application No. 62/738,970, filed on Sep. 28, 2018.

(51) Int. Cl.

| | |
|---|---|
| ***H01L 25/00*** | (2006.01) |
| ***H03K 19/00*** | (2006.01) |
| ***H03K 19/1776*** | (2020.01) |
| ***H01L 27/105*** | (2006.01) |
| ***H03K 19/20*** | (2006.01) |

(52) U.S. Cl.
CPC ..... *H03K 19/1776* (2013.01); *H01L 27/1052* (2013.01); *H03K 19/20* (2013.01)

(58) Field of Classification Search
None
See application file for complete search history.

(56) References Cited

U.S. PATENT DOCUMENTS

| | | | |
|---|---|---|---|
| 4,240,093 | A | 12/1980 | Dingwall |
| 8,796,666 | B1 | 8/2014 | Huang et al. |
| 8,815,712 | B2 | 8/2014 | Wan et al. |
| 8,963,258 | B2 | 2/2015 | Yu et al. |
| 9,093,530 | B2 | 7/2015 | Huang et al. |
| 9,171,929 | B2 | 10/2015 | Lee et al. |
| 9,214,555 | B2 | 12/2015 | Oxland et al. |
| 9,236,267 | B2 | 1/2016 | De et al. |
| 9,520,482 | B1 | 12/2016 | Chang et al. |
| 9,548,303 | B2 | 1/2017 | Lee et al. |

(Continued)

FOREIGN PATENT DOCUMENTS

| | | | |
|---|---|---|---|
| TW | I591697 | B | 7/2017 |
| TW | 201801323 | A | 1/2018 |

*Primary Examiner* — Anh Q Tran
(74) *Attorney, Agent, or Firm* — Haynes and Boone, LLP

(57) ABSTRACT

Structures and methods for the co-optimization of core (logic) devices and SRAM devices include a semiconductor device having a logic portion and a memory portion. In some embodiments, a logic device is disposed within the logic portion. In some cases, the logic device includes a single fin N-type FinFET and a single fin P-type FinFET. In some examples, a static random-access memory (SRAM) device is disposed within the memory portion. The SRAM device includes an N-well region disposed between two P-well regions, where the two P-well regions include an N-type FinFET pass gate (PG) transistor and an N-type FinFET pull-down (PD) transistor, and where the N-well region includes a P-type FinFET pull-up (PU) transistor.

20 Claims, 9 Drawing Sheets

(56) References Cited

U.S. PATENT DOCUMENTS 9,548,374 B2 1/2017 Zhang et al.
9,576,814 B2 2/2017 Wu et al.
2010/0230762 A1* 9/2010 Burnett ............... H01L 27/1108 257/369
2013/0141963 A1* 6/2013 Liaw ..................... G11C 11/412 365/156
2015/0041924 A1 2/2015 Moroz
2016/0163717 A1* 6/2016 Liaw ................... H01L 27/1104 438/229
2017/0207126 A1* 7/2017 Ching ................. H01L 29/7848

* cited by examiner

SEMICONDUCTOR DEVICE FOR LOGIC AND MEMORY CO-OPTIMIZATION

CROSS-REFERENCE TO RELATED APPLICATION

This application claims the benefit of U.S. Provisional Application No. 62/738,970, filed Sep. 28, 2018, the entirety of which is incorporated by reference herein.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). FinFETs have been used in a variety of applications, for example, to implement logic devices/circuits and to provide static random-access memory (SRAM) devices, among others. Generally, logic devices are focused on performance (e.g., high Ion/Ioff ratio, low parasitic capacitance, etc.), while SRAM devices may focus on optimizing cell size and improving cell operation voltage, among other requirements. However, optimization of both logic and SRAM performance and/or design requirements has been challenging. As merely one example, reduction of a FinFET fin critical dimension (CD) may improve logic device Ion/Ioff performance but may also degrade SRAM latch-up performance. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
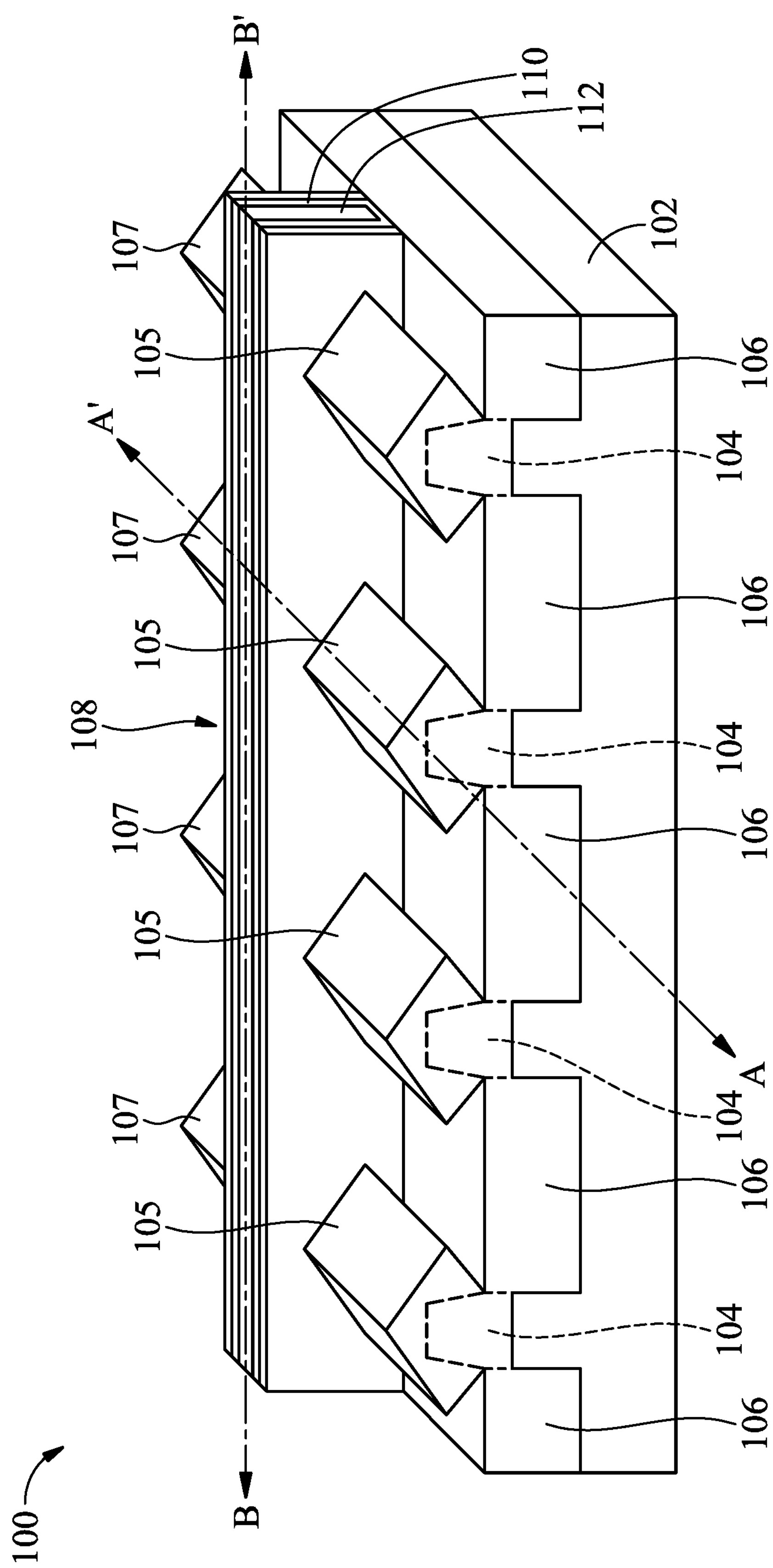
FIG. 1 is perspective view of an embodiment of a FinFET device according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with “about,” “approximate,” and the like, the term is intended to encompass numbers that are within a reasonable range including the number described, such as within +/−10% of the number described or other values as understood by person skilled in the art. For example, the term “about 5 nm” encompasses the dimension range from 4.5 nm to 5.5 nm.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

The present disclosure is generally related to semiconductor devices and methods of forming the same. In particular, embodiments of the present disclosure provide a process and/or structure for logic circuit and SRAM cell co-optimization to simultaneously achieve both high speed and low power consumption.

FinFETs have become a popular candidate for high performance and low leakage applications (e.g., such as for logic devices and/or circuits). In various examples, FinFET transistors employ a narrow fin width for short channel control, Ion/Ioff ratio improvement, and continuous scaling of the gate length. However, this narrow fin width has resulted in smaller top source/drain regions and has thus impacted the contact-to-source/drain landing margin and increased contact resistance. To address this issue, a longer contact layout was proposed, but gate-to-contact capacitance remained a major concern. FinFET devices having multiple fins have been used for high speed applications, but such devices suffered from increased leakage and power consumption. In some embodiments, a single fin FinFET device may be used to mitigate the leakage and power consumption issues, but this may also result in a loss of device speed.

For SRAM cells, where cell size optimization and cell operation voltage are key, the isolation rules between N+ and N-well (NW) regions, and between P+ and P-well (PW) regions have usually been pushed (reduced) to achieve a smaller SRAM cell size. However, the narrow fin width (e.g., required by logic devices) also negatively impacts N-well/P-well doping efficiency due to a thermal/implant out-diffusion effect, resulting in lightly-doped well regions. In some cases, the lightly doped well regions will result in worse leakage for N+/PW/NW structures and for P+/NW/PW structures. In various examples, thinner and more lightly doped fin well regions also detrimentally impact the well resistance and degrade the SRAM cell latch-up performance. Thus, existing techniques have not proved entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include structures and methods for the co-optimization of core (logic) devices and SRAM devices. In various embodiments, a semiconductor device may include individual device structures to meet both logic device requirements and SRAM requirements. In some cases, logic transistors may have a narrow fin CD for Ion/Ioff ratio improvement, and SRAM devices may have a thicker fin CD (e.g., compared to the logic devices) to avoid latch-up (e.g., by providing improved well resistance and N+PW/NW, P+/NW/PW isolation leakage improvement). In some examples, logic transistors may have a shorter gate electrode end-cap for contact-to-gate capacitance reduction, and SRAM devices may have a longer gate electrode end-cap for Vt stability improvement and Vcc_min reduction. In some embodiments, logic transistors may have wider well isolation space rules (e.g., N+ OD to N_Well, P+OD to P_well) for latch-up and well isolation leakage improvement, and SRAM devices may push (reduce) narrow well isolation space rules (e.g., N+ OD to N_Well, P+OD to P_Well) for cell size reduction. Generally, the various embodiments disclosed herein provide for the simultaneous optimization of logic device performance, SRAM cell scaling, and manufacturing process margin. Additional embodiments and advantages are discussed below and/or will be evident to those skilled in the art in possession of this disclosure.

Because one or more of the embodiments described herein are exemplified using FinFETs, for example for logic devices and for SRAM devices, a description of such devices is provided below with respect to FIGS. 1 and 2. However, it should be understood that other types of devices may benefit from one or more of the embodiments described herein.

Referring first to FIG. 1, illustrated therein is an exemplary FinFET device 100. The FinFET device 100 includes one or more fin-based, multi-gate field-effect transistors (FETs). The FinFET device 100 includes a substrate 102, at least one fin element 104 extending from the substrate 102, isolation regions 106, and a gate structure 108 disposed on and around the fin-element 104. The substrate 102 may be a semiconductor substrate such as a silicon substrate. The substrate may include various layers, including conductive or insulating layers formed on a semiconductor substrate. The substrate may include various doping configurations depending on design requirements as is known in the art. The substrate may also include other semiconductors such as germanium, silicon carbide (SiC), silicon germanium (SiGe), or diamond. Alternatively, the substrate may include a compound semiconductor and/or an alloy semiconductor. Further, in some embodiments, the substrate may include an epitaxial layer (epi-layer), the substrate may be strained for performance enhancement, the substrate may include an SOI structure, and/or the substrate may have other suitable enhancement features.

The fin-element 104, like the substrate 102, may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fin elements 104 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, patterning the resist to form the making element may be performed using an electron beam (e-beam) lithography process. The masking element may then be used to protect regions of the substrate while an etch process forms recesses into the silicon layer, thereby leaving an extending fin element 104. The recesses may be etched using a dry etch, a wet etch, and/or other suitable processes. Numerous other embodiments of methods to form the fin elements 104 on the substrate 102 may also be used.

Each of the plurality of fin elements 104 also include a source region 105 and a drain region 107 where the source/drain regions 105, 107 are formed in, on, and/or surrounding the fin element 104. The source/drain regions 105, 107 may be epitaxially grown over the fin elements 104. A channel region of a transistor is disposed within the fin element 104, underlying the gate structure 108, along a plane substantially parallel to a plane defined by section AA' of FIG. 1. In some examples, the channel region of the fin includes a high-mobility material such as germanium, as well as any of the compound semiconductors or alloy semiconductors discussed above and/or combinations thereof. High-mobility materials include those materials with an electron mobility greater than silicon. For example, higher than Si which has an intrinsic electron mobility at room temperature (300 K) of around 1350 $cm^2/V\text{-}s$ and a hole mobility of around 480 $cm^2/V\text{-}s$, in some instances.

The isolation regions 106 may be shallow trench isolation (STI) features. Alternatively, a field oxide, a LOCOS feature, and/or other suitable isolation features may be implemented on and/or within the substrate 102. The isolation regions 106 may be composed of silicon oxide, silicon nitride, silicon oxynitride, fluorine-doped silicate glass (FSG), a low-k dielectric, combinations thereof, and/or other suitable material known in the art. In an embodiment, the isolation structures are STI features and are formed by etching trenches in the substrate 102. The trenches may then be filled with isolating material, followed by a chemical mechanical polishing (CMP) process. However, other embodiments are possible. In some embodiments, the isolation regions 106 may include a multi-layer structure, for example, having one or more liner layers.

The gate structure 108 includes a gate stack including a gate dielectric layer 110, and a metal layer 112 formed over the gate dielectric layer. In some embodiments, the gate dielectric layer 110 may include an interfacial layer formed over the channel region of the fin element 104 and a high-K dielectric layer over the interfacial layer. The interfacial layer of the gate dielectric layer 110 may include a dielectric material such as silicon oxide layer ($SiO_2$) or silicon oxynitride (SiON). The high-K dielectric layer of the gate dielectric layer 110 may include $HfO_2$, $TiO_2$, HfZrO, $Ta_2O_3$, $HfSiO_4$, $ZrO_2$, $ZrSiO_2$, combinations thereof, or other suitable materials. In still other embodiments, the gate dielectric layer 110 may include silicon dioxide or another suitable dielectric. The gate dielectric layer 110 may be formed by chemical oxidation, thermal oxidation, atomic layer deposition (ALD), physical vapor deposition (PVD), chemical vapor deposition (CVD), and/or other suitable methods.

The metal layer 112 may include a conductive layer such as W, TiN, TaN, WN, Re, Ir, Ru, Mo, Al, Cu, Co, Ni, combinations thereof, and/or other suitable compositions. In some embodiments, the metal layer 112 may include a first group of metal materials for N-type FinFETs and a second group of metal materials for P-type FinFETs. Thus, the FinFET device 100 may include a dual work-function metal gate configuration. For example, the first metal material (e.g., for N-type devices) may include metals having a work function substantially aligned with a work function of the substrate conduction band, or at least substantially aligned with a work function of the conduction band of the channel region of the fin element 104. Similarly, for example, the second metal material (e.g., for P-type devices) may include metals having a work function substantially aligned with a work function of the substrate valence band, or at least substantially aligned with a work function of the valence band of the channel region of the fin element 104. Thus, the metal layer 112 may provide a gate electrode for the FinFET device 100, including both N-type and P-type FinFET devices 100. In some embodiments, the metal layer 112 may alternately include a polysilicon layer. The metal layer 112 may be formed using PVD, CVD, electron beam (e-beam) evaporation, and/or other suitable process. In some embodiments, sidewall spacers are formed on sidewalls of the gate structure 108. The sidewall spacers may include a dielectric material such as silicon oxide, silicon nitride, silicon carbide, silicon oxynitride, or combinations thereof.

Figure 2:
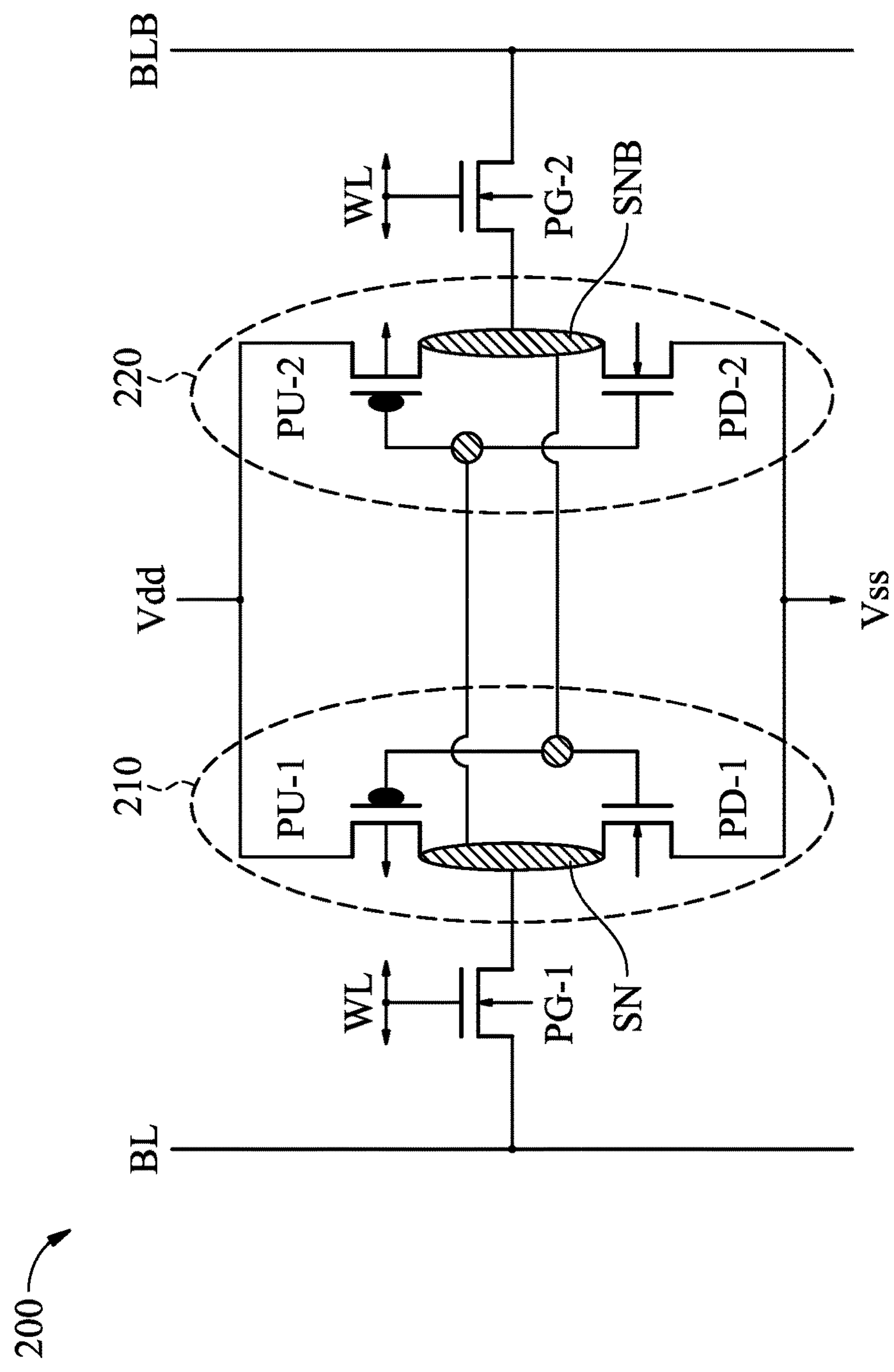
FIG. 2, provides an exemplary circuit diagram of an SRAM cell, which can be implemented in a memory cell of a SRAM array, according to various aspects of the present disclosure.

Referring now to FIG. 2, illustrated therein is an exemplary circuit diagram of an SRAM cell 200, which can be implemented in a memory cell of a SRAM array, according to various aspects of the present disclosure. While FIG. 2 illustrates a single-port SRAM cell, it will be understood that the various disclosed embodiments may be equally implemented in a multi-port SRAM cell (e.g., such as a dual-port SRAM cell), without departing from the scope of the present disclosure. FIG. 2 has been simplified for the sake of clarity to better understand the inventive concepts of the present disclosure. Additional features can be added in the SRAM cell 200, and some of the features described below can be replaced, modified, or eliminated in other embodiments of SRAM cell 200.

The SRAM cell 200 includes six transistors: a pass-gate transistor PG-1, a pass-gate transistor PG-2, a pull-up transistor PU-1, a pull-up transistor PU-2, a pull-down transistor PD-1, and a pull-down transistor PD-2. Thus, in some examples, the SRAM cell 200 may be referred to as a 6T SRAM cell. In operation, pass-gate transistor PG-1 and pass-gate transistor PG-2 provide access to a storage portion of the SRAM cell 200, which includes a cross-coupled pair of inverters, an inverter 210 and an inverter 220. Inverter 210 includes the pull-up transistor PU-1 and the pull-down transistor PD-1, and inverter 220 includes the pull-up transistor PU-2 and the pull-down transistor PD-2. In some implementations, pull-up transistors PU-1, PU-2 are configured as P-type FinFETs, and pull-down transistors PD-1, PD-2 are configured as N-type FinFETs. For example, pull-up transistors PU-1, PU-2 each include a gate structure disposed over a channel region of an N-type fin structure (including one or more N-type fins), such that the gate structure interposes P-type source/drain regions of the N-type fin structure (e.g., P-type epitaxial source/drain features), where the gate structure and the N-type fin structure are disposed over an N-type well region; and pull-down transistors PD-1, PD-2 each include a gate structure disposed over a channel region of a P-type fin structure (including one or more P-type fins), such that the gate structure interposes N-type source/drain regions of the P-type fin structure (e.g., N-type epitaxial source/drain features), where the gate structure and the P-type fin structure are disposed over a P-type well region. In some implementations, pass-gate transistors PG-1, PG-2 are also configured as N-type FinFETs. For example, pass-gate transistors PG-1, PG-2 each include a gate structure disposed over a channel region of a P-type fin structure (including one or more P-type fins), such that the gate structure interposes N-type source/drain regions of the P-type fin structure (e.g., N-type epitaxial source/drain features), where the gate structure and the P-type fin structure are disposed over a P-type well region.

A gate of pull-up transistor PU-1 interposes a source (electrically coupled with a power supply voltage (Vdd)) and a first common drain (CD1), and a gate of pull-down transistor PD-1 interposes a source (electrically coupled with a power supply voltage (Vss)) and the first common drain. A gate of pull-up transistor PU-2 interposes a source (electrically coupled with power supply voltage (Vdd)) and a second common drain (CD2), and a gate of pull-down transistor PD-2 interposes a source (electrically coupled with power supply voltage (Vss)) and the second common drain. In some implementations, the first common drain (CD1) is a storage node (SN) that stores data in true form, and the second common drain (CD2) is a storage node (SNB) that stores data in complementary form. The gate of pull-up transistor PU-1 and the gate of pull-down transistor PD-1 are coupled with the second common drain, and the gate of pull-up transistor PU-2 and the gate of pull-down transistor PD-2 are coupled with the first common drain. A gate of pass-gate transistor PG-1 interposes a source (electrically coupled with a bit line BL) and a drain, which is electrically coupled with the first common drain. A gate of pass-gate transistor PG-2 interposes a source (electrically coupled with a complementary bit line BLB) and a drain, which is electrically coupled with the second common drain. The gates of pass-gate transistors PG-1, PG-2 are electrically coupled with a word line WL. In some implementations, pass-gate transistors PG-1, PG-2 provide access to storage nodes SN, SNB during read operations and/or write operations. For example, pass-gate transistors PG-1, PG-2 couple storage nodes SN, SN-B respectively to bit lines BL, BLB in response to voltage applied to the gates of pass-gate transistors PG-1, PG-2 by WLs.

Figure 3:
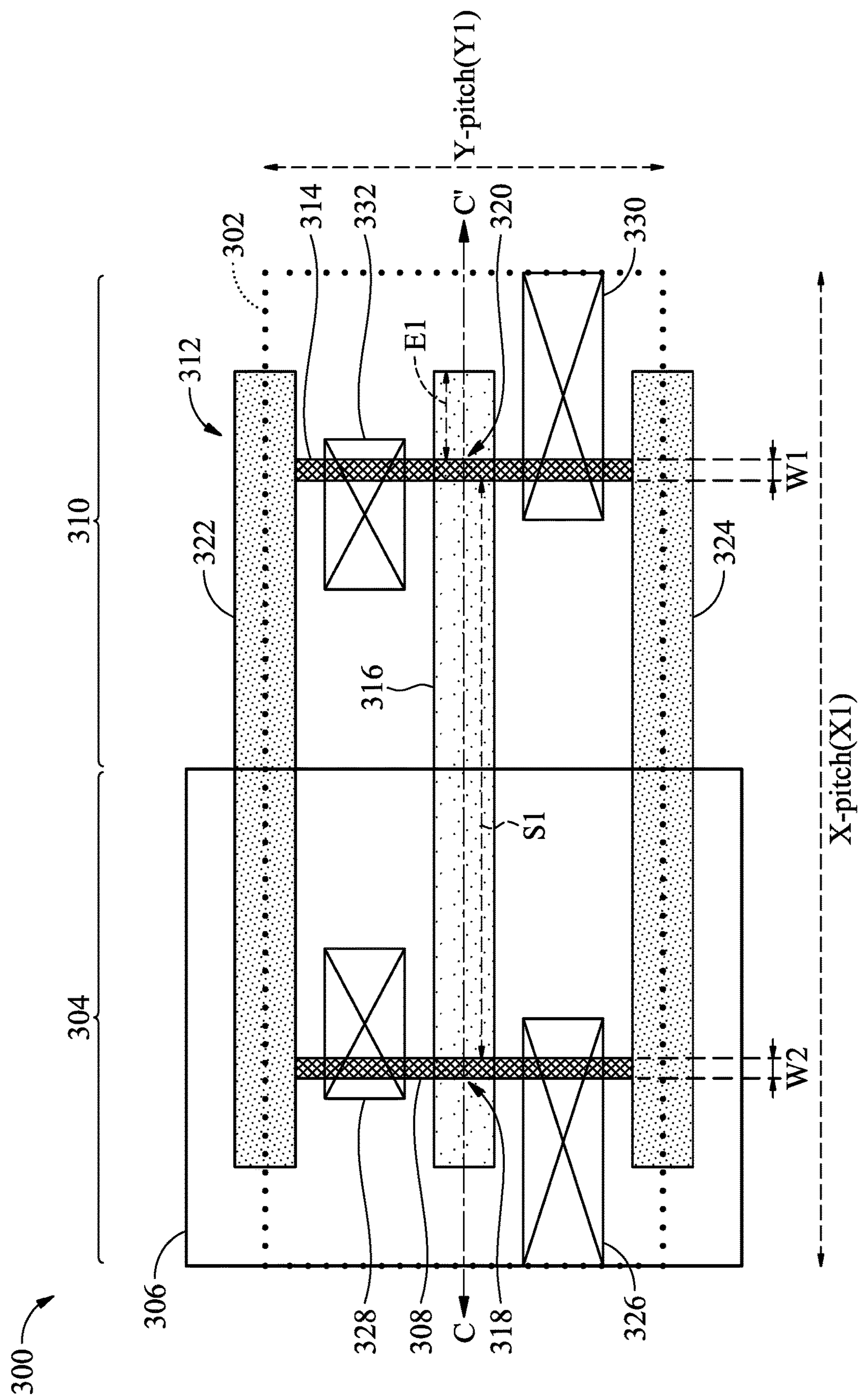
FIG. 3 provides an exemplary plan view of a logic device, in accordance with some embodiments.
Figure 4:
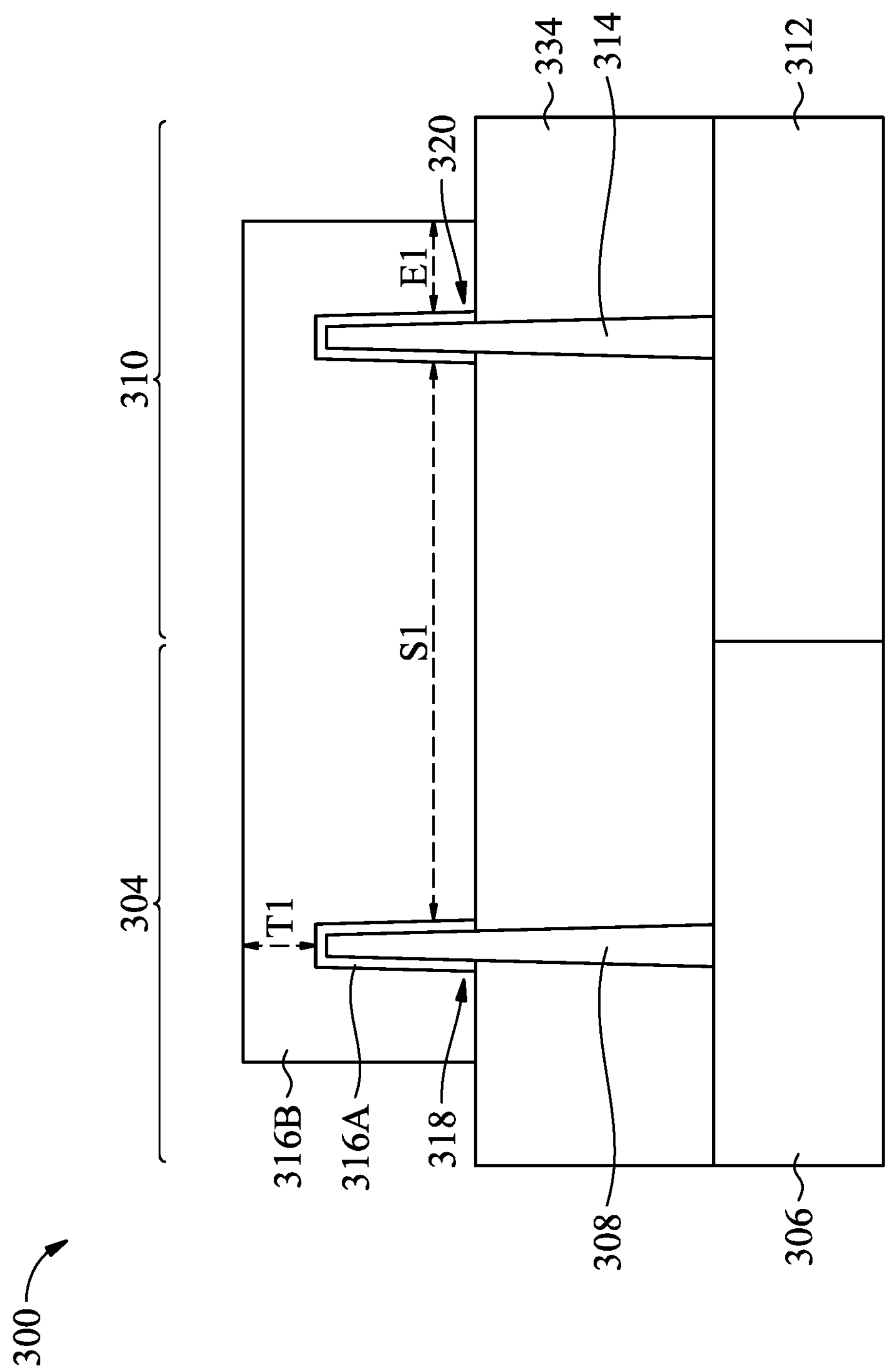
FIG. 4 provides a cross-sectional view of the logic device of FIG. 3, along a plane substantially parallel to a plane defined by section CC' of FIG. 3, according to some embodiments.
Figure 5:
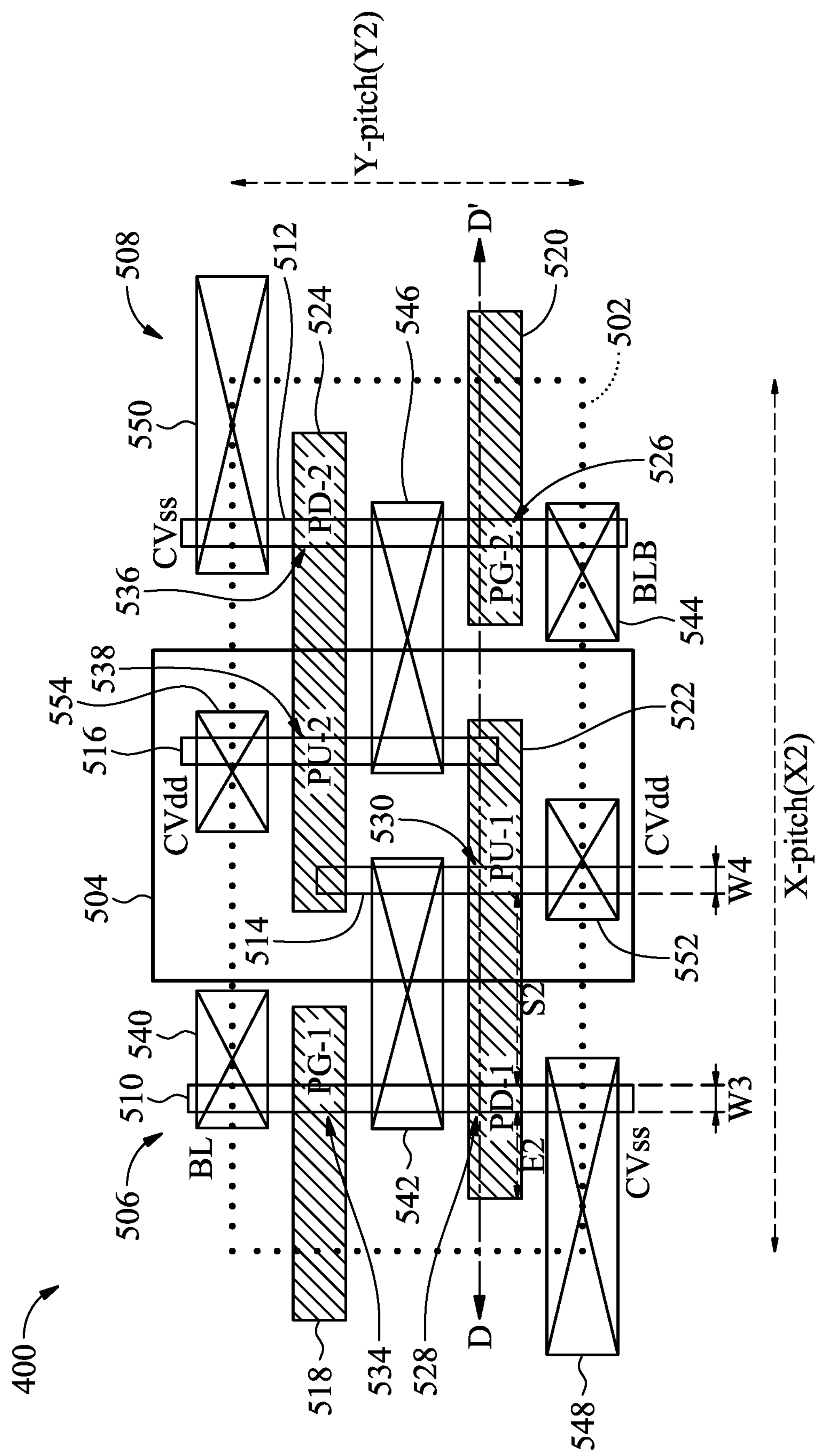
FIG. 5 provides an exemplary plan view of an SRAM cell, in accordance with some embodiments.
Figure 6:
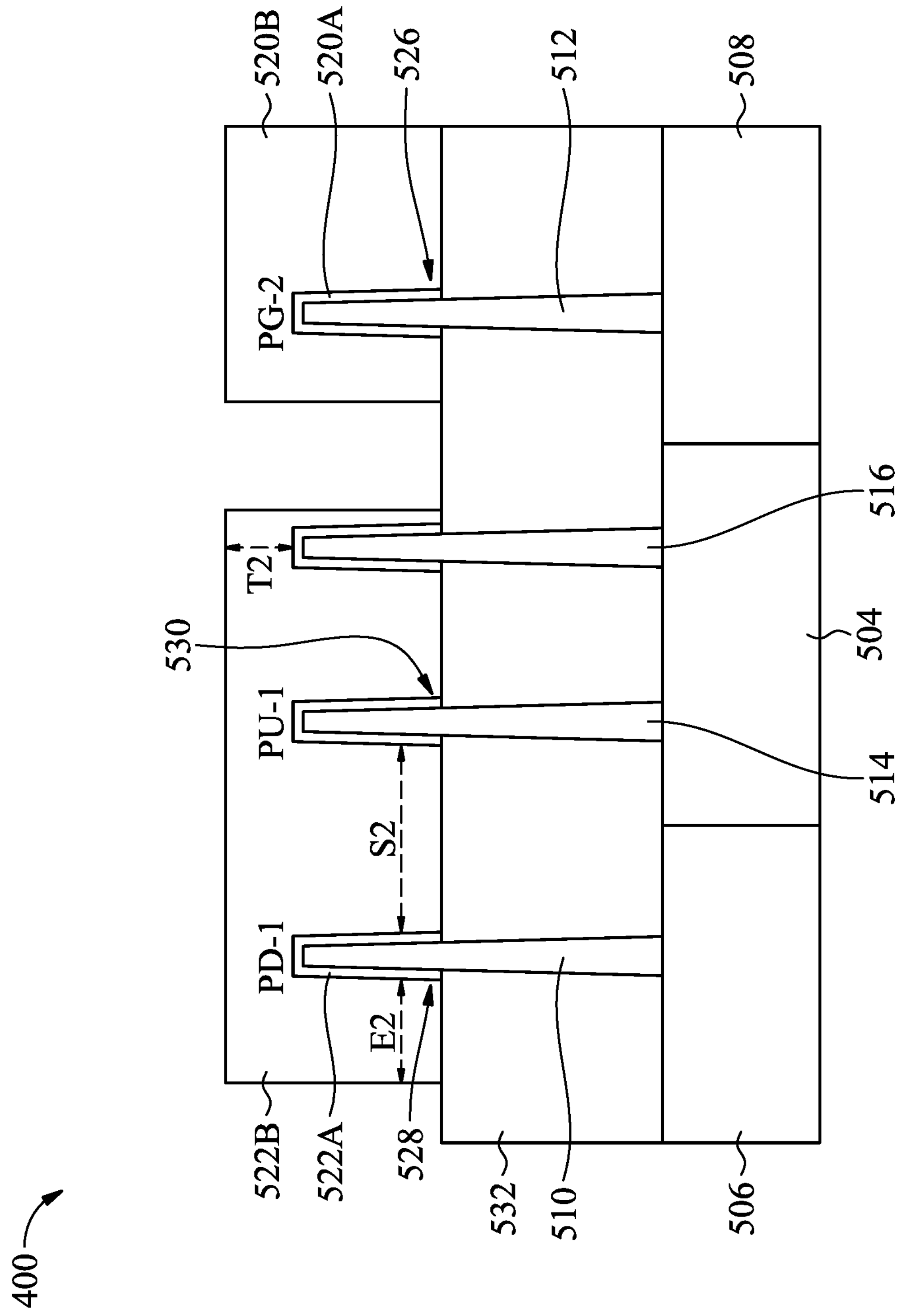
FIG. 6 provides a cross-sectional view of the SRAM cell of FIG. 5, along a plane substantially parallel to a plane defined by section DD' of FIG. 5, according to some embodiments.
Figure 7:
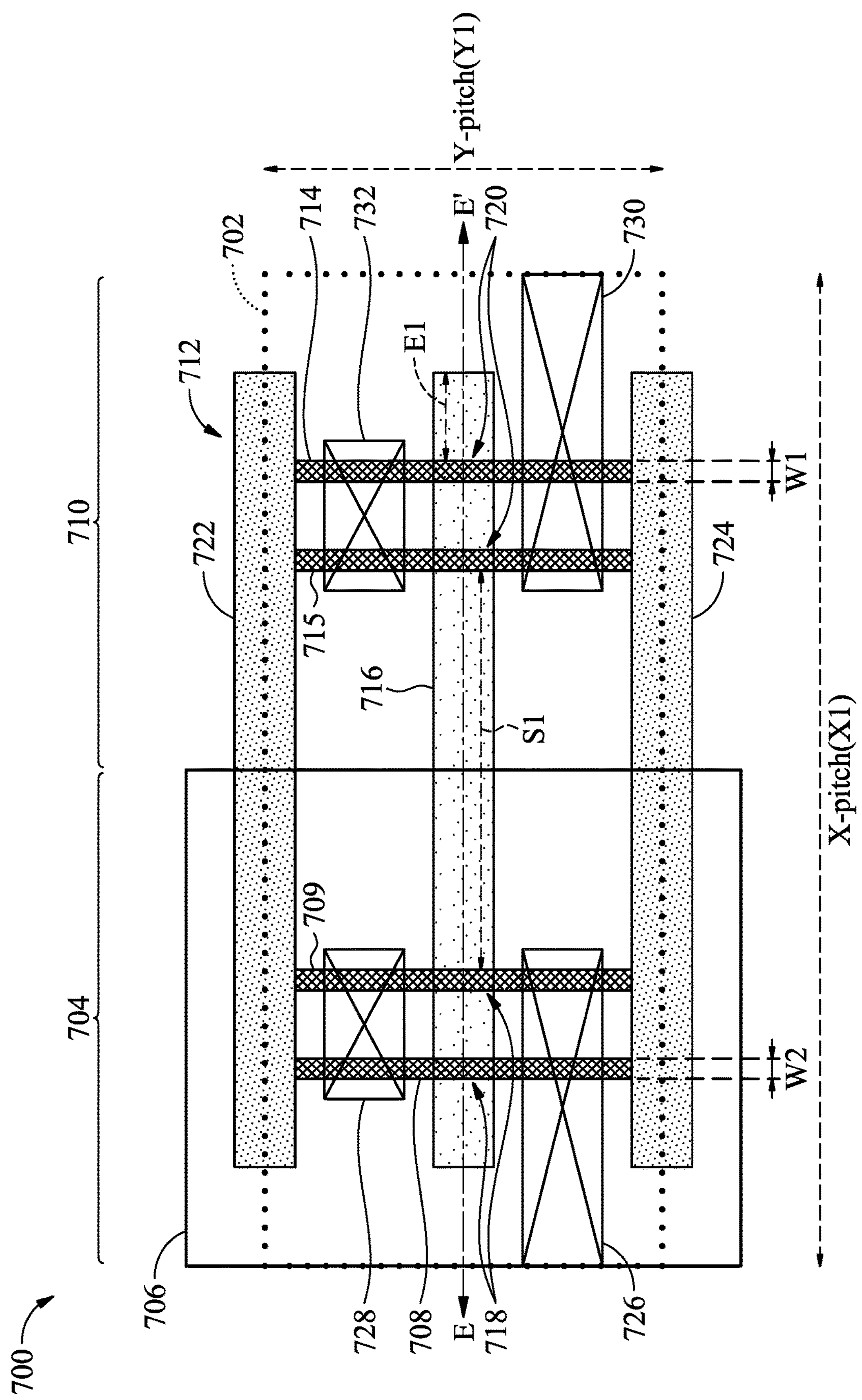
FIG. 7 provides an exemplary plan view of another logic device, in accordance with some embodiments.
Figure 8:
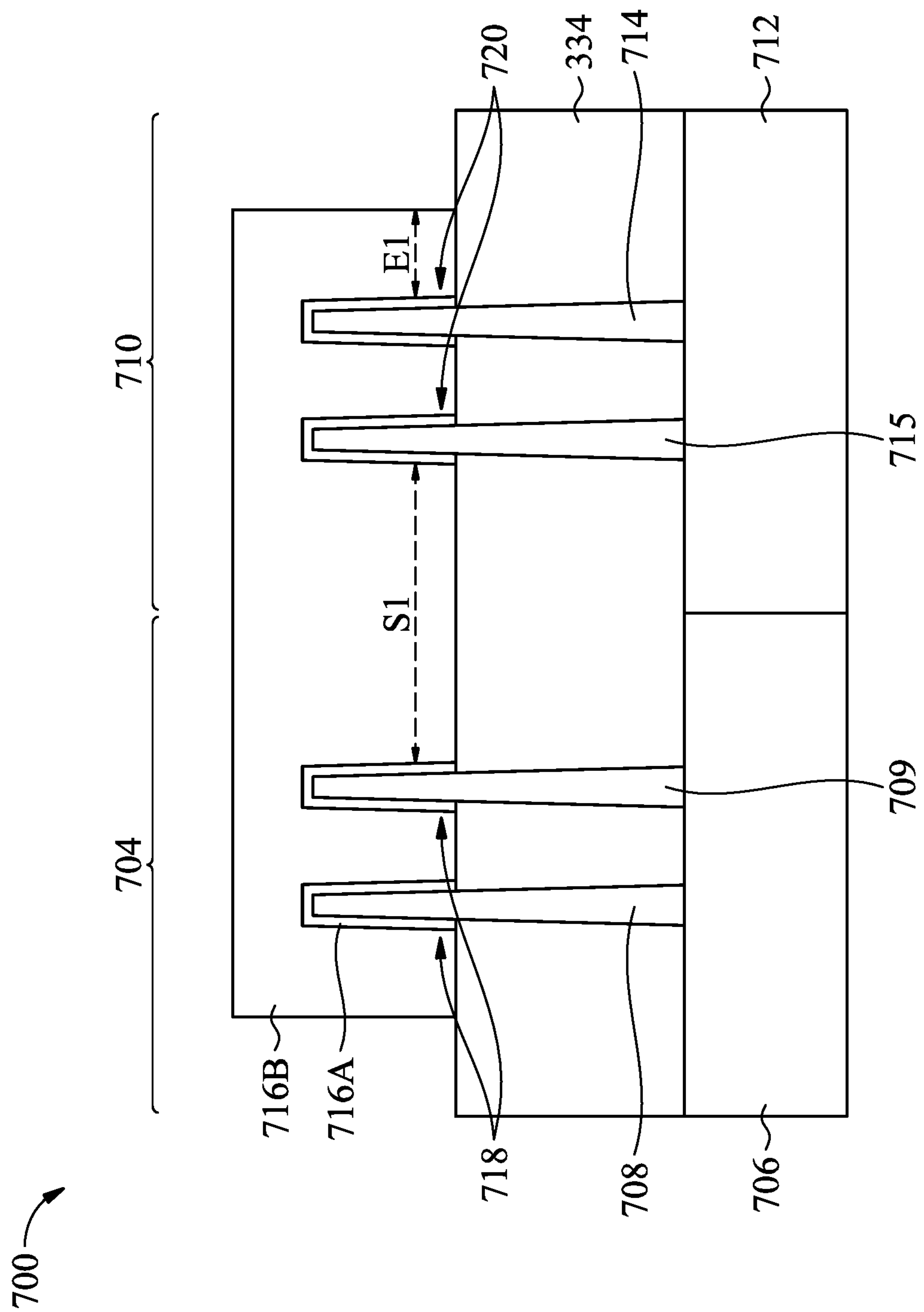
FIG. 8 provides a cross-sectional view of the logic device of FIG. 7, along a plane substantially parallel to a plane defined by section EE' of FIG. 7, according to some embodiments.

In view of the above discussion with respect to FIGS. 1 and 2, various embodiments of the present disclosure are now described. FIGS. 3 and 7 provide exemplary plan views of a logic device, in accordance with some embodiments. FIG. 5 provides an exemplary plan view of an SRAM cell, in accordance with some embodiments. In some embodiments, the logic and SRAM devices shown and described may be fabricated on the same substrate, for example, as part of an integrated semiconductor device that provides co-optimization of both logic and SRAM devices. FIG. 4 provides a cross-sectional view of the logic device of FIG. 3, along a plane substantially parallel to a plane defined by section CC' of FIG. 3; FIG. 6 provides a cross-sectional view of the SRAM cell of FIG. 5, along a plane substantially parallel to a plane defined by section DD' of FIG. 5; and FIG. 8 provides a cross-sectional view of the logic device of FIG. 7, along a plane substantially parallel to a plane defined by section EE' of FIG. 7. It is understood that the various figures, and any accompanying descriptions given, are merely exemplary and are not intended to be limiting beyond what is specifically recited in the claims that follow. In addition, the various figures shown and described have been simplified for the sake of clarity to better understand the inventive concepts of the present disclosure, and various features may be added, replaced, modified, or eliminated, without departing from the scope of the present disclosure.

With reference now to FIGS. 3-6, and in some embodiments, a semiconductor device (e.g., on a given substrate) may include a plurality of logic devices 300 (e.g., within a logic portion of the semiconductor device) and a plurality of SRAM devices 400 (e.g., within a memory portion of the semiconductor device). FIG. 3 illustrates an exemplary plan view of the logic device 300, and FIG. 4 provides a cross-sectional view of the logic device 300, along a plane substantially parallel to a plane defined by section CC' of FIG. 3. In some embodiments, the logic device 300 includes a complementary metal-oxide-semiconductor (CMOS) inverter unit cell 302. As shown, the unit cell 302 has an X-pitch 'X1' parallel to a gate routing direction (e.g., parallel to a gate 316) and a Y-pitch 'Y1' parallel to a fin active region routing direction (e.g., parallel to fins 308, 314). In some embodiments, the X-pitch 'X1' is greater than the Y-pitch 'Y1'. For instance, in some cases, the X-pitch 'X1' is about 2 to 3 times greater than the Y-pitch 'Y1'. Generally, in various embodiments, the logic device 300 may include an inverter, an AND gate, a NAND gate, an OR gate, a NOR gate, a flip-flop, scan logic, or combinational logic. Such logic devices may, in some examples, be interconnected to form a circuit including a plurality of logic cells (e.g., such as the logic device 300). In some embodiments, the logic device 300 includes a plurality of CMOS devices. In some cases, the various CMOS devices (e.g., such as the CMOS inverter of the logic device 300) may be formed by a single fin N-type FinFET and a single fin P-type FinFET.

For instance, the logic device 300 includes a P-type FinFET 304 formed over an N-well region 306 and including a single fin 308, and an N-type FinFET 310 formed over a P-well region 312 and including a single fin 314. In some embodiments, the X-pitch 'X1' is defined from a left edge of the N-well region 306 to a right edge of the P-well region 312. By way of example, the fin 308 is spaced from the fin 314 by a spacing 'S1'. In various cases, the fins 308, 314 may be similar to the fin elements 104, discussed above with reference to FIG. 1. Fin cut regions 322, 324 identify regions where the fins 308, 314 are cut, for example, to provide isolation to neighboring devices. In some embodiments, the Y-pitch 'Y1' is defined between the fin cut regions 322, 324. The logic device 300 also includes a gate 316 that spans perpendicularly across both the fin 308 of the P-type FinFET 304 and the fin 314 of the N-type FinFET 310. In some embodiments, the gate 316 extends beyond (overhangs) the fins 308, 314 by an end-cap length 'E1'. In various examples, the gate 316 may be similar to the gate structure 108, discussed above with reference to FIG. 1. Thus, the gate 316 may include a dielectric layer 316A (e.g., including an interfacial layer and a high-K dielectric layer) formed over a channel region 318 of the fin 308 and over a channel region 320 of the fin 314, and a metal layer 316B formed over the dielectric layer 316A. In some embodiments, the end-cap length 'E1' is at least two times greater than a thickness 'T1' of the metal layer 316B. The logic device 300 may also include isolation regions 334, which in some cases may be similar to the isolation regions 106, discussed above with reference to FIG. 1.

In some embodiments, each of the P-type FinFET 304 and the N-type FinFET 310 include source/drain regions on portions of the fins 308, 314 adjacent to and on either side of the gate 316, and thus adjacent to and on either side of the channel regions 318, 320. In some examples, the source/drain regions of the P-type FinFET 304 and the N-type FinFET 310 may be similar to the source/drain regions 105, 107, discussed above with reference to FIG. 1. In some examples, a plurality of contacts may be directly (physically) connected to the source/drain regions. For example, the P-type FinFET 304 may include a source contact 326 and a drain contact 328 connected to respective source/drain regions of the P-type FinFET 304. Similarly, the N-type FinFET 310 may include a source contact 330 and a drain contact 332 connected to respective source/drain regions of the N-type FinFET 310. In some embodiments, the X-pitch 'X1' is defined from a left edge of the source contact 326 to a right edge of the source contact 330.

FIG. 5 illustrates an exemplary plan view of the SRAM device 400, and FIG. 6 provides a cross-sectional view of the SRAM device 400, along a plane substantially parallel to a plane defined by section DD' of FIG. 5. In particular, the SRAM device 400 shows an SRAM unit cell 502 having an X-pitch 'X2' parallel to a gate routing direction (e.g., parallel to gates 518, 520, 522, 524) and a Y-pitch 'Y2' parallel to a fin active region routing direction (e.g., parallel to fins 510, 512, 514, 516). In some examples, the X-pitch 'X2' is greater than the Y-pitch 'Y2'. For instance, in some cases, the X-pitch 'X2' is about 2 to 3 times greater than the Y-pitch 'Y2'. In some embodiments, the SRAM device 400 may include a plurality of SRAM unit cells 502 arranged, for example, in a plurality of columns and rows (e.g., to provide a memory array). In some cases, the SRAM unit cell 502 may include an N-well region 504 disposed between two P-well regions 506, 508. In some embodiments, the X-pitch 'X2' is defined from a left edge of the P-well region 506 to a right edge of the P-well region 508. In some embodiments, the P-well region 506 includes an N-type FinFET pass gate (PG-1) transistor and an N-type FinFET pull-down (PD-1) transistor, and the P-well region 508 includes an N-type FinFET pass gate (PG-2) transistor and an N-type FinFET pull-down (PD-2) transistor. In some examples, the N-well region 504 may include a first P-type FinFET pull-up (PU-1) and a second P-type FinFET pull-up (PU-2) transistor.

In various embodiments, the PG-1, PG-2, PD-1, PD-2, PU-1, and PU-2 transistors are formed using a single fin FinFET. For example, the PG-1, PG-2, PD-1, and PD-2 transistors may be formed by a single fin N-type FinFET, and the PU-1 and PU-2 transistors may be formed by a single fin P-type FinFET. As shown in the example of FIG. 5, the PG-1 and PD-1 transistors include a single fin 510, the PG-2 and PD-2 transistors include a single fin 512, and the PU-1 and PU-2 transistors include single fins 514 and 516, respectively. In various examples, a fin spacing 'S2' may be defined (e.g., such as between the fin 510 and the fin 514, or between other pairs of fins). The fins 510, 512, 514, and 516 may be similar to the fin elements 104, discussed above with reference to FIG. 1.

Each of the PG-1, PG-2, PD-1, PD-2, PU-1, and PU-2 transistors of the SRAM device 400 also include a gate, as shown in the example of FIG. 5. For instance, PG-1 includes a gate 518 that spans perpendicularly across a channel region 534 of the fin 510, PG-2 includes a gate 520 that spans perpendicularly across a channel region 526 of the fin 512, PD-1 and PU-1 include a gate 522 that spans perpendicularly across a channel region 528 of the fin 510 and across a channel region 530 of the fin 514, and PD-2 and PU-2 include a gate 524 that spans perpendicularly across a channel region 536 of the fin 512 and across a channel region 538 of the fin 516. In some embodiments, a gate may extend beyond (overhang) a fin by an end-cap length 'E2' (e.g., such as the gate 522 extending beyond the fin 510, or another gate extending beyond a respective fin over which it is disposed). In various examples, the gates 518, 520, 522, and 524 may be similar to the gate structure 108, discussed above with reference to FIG. 1. Thus, the gates 518, 520, 522, 524 may include a dielectric layer (e.g., including an interfacial layer and a high-K dielectric layer) formed over respective channel regions of the fins over which the various gates are disposed, and a metal layer formed over the dielectric layer. As one example, and as shown in FIGS. 5 and 6, the gate 520 of PG-2 may include a dielectric layer 520A formed over the channel region 526 of the fin 512 and a metal layer 520B formed over the dielectric layer 520A, and the gate 522 of PD-1 and PU-1 may include a dielectric layer 522A formed over the channel region 528 of the fin 510 and over a channel region 530 of the fin 514, and a metal layer 522B formed over the dielectric layer 522A. In some embodiments, the end-cap length 'E2' is at least two times greater than a thickness 'T2' of the metal layer 522B. The SRAM device 400 may also include isolation regions 532, which in some cases may be similar to the isolation regions 106, discussed above with reference to FIG. 1.

In various embodiments, each of the PG-1, PG-2, PD-1, PD-2, PU-1, and PU-2 transistors of the SRAM device 400 includes source/drain regions on portions of their respective fins adjacent to and on either side of their respective gates, and thus adjacent to and on either side of their respective channel regions (e.g., such as the channel regions 526, 528, 530, 534, 536, and 538). In some examples, the source/drain regions of each of the PG-1, PG-2, PD-1, PD-2, PU-1, and PU-2 transistors may be similar to the source/drain regions 105, 107, discussed above with reference to FIG. 1. In some examples, a plurality of contacts may be directly (physically) connected to the source/drain regions of the SRAM device 400. For example, the PG-1 transistor may include a source contact 540 (bit-line node 'BL') and a drain contact 542 (first common drain) connected to respective source/drain regions of the PG-1 transistor, the PG-2 transistor may include a source contact 544 (bit-line-bar node 'BLB') and a drain contact 546 (second common drain) connected to respective source/drain regions of the PG-2 transistor, the PD-1 transistor may include a source contact 548 (CVss node) and the drain contact 542 (first common drain) connected to respective source/drain regions of the PD-1 transistor, the PD-2 transistor may include a source contact 550 (CVss node) and the drain contact 546 (second common drain) connected to respective source/drain regions of the PD-2 transistor, the PU-1 transistor may include a source contact 552 (CVdd node) and the drain contact 542 (first common drain) connected to respective source/drain regions of the PU-1 transistor, and the PU-2 transistor may include a source contact 554 (CVdd node) and the drain contact 546 (second common drain) connected to respective source/drain regions of the PU-2 transistor. In some cases, the X-pitch 'X2' is defined between the source contact 548 (CVss node) and the source contact 550 (CVss node). In some embodiments, the Y-pitch 'Y2' is defined between the source contact 544 (BLB), 548 (CVss node), or 552 (CVdd node) and the source contact 540 (BL), 550 (CVss node), or 554 (CVdd node).

With respect to the logic device 300 of FIGS. 3 and 4, it is noted that the N-type FinFET 310 has a first fin width (W1) in the channel region 320 of the fin 314, and the P-type FinFET 304 has a second fin width (W2) in the channel region 318 of the fin 308. With respect to the SRAM device 400 of FIGS. 5 and 6, it is noted that the PD transistors (e.g., the PD-1 and the PD-2 transistors) have a third fin width (W3), for example, in the channel region 528 of the fin 510 and/or in the channel region 536 of the fin 512. Further, the PU transistors (e.g., the PU-1 and the PU-2 transistors) have a fourth fin width (W4), for example, in the channel region 530 of the fin 514 and/or in the channel region 538 of the fin 516.

In some cases, the first fin width (W1) of the logic device 300 is narrower than the third fin width (W3) of the SRAM device 400. In some embodiments, the first fin width (W1) of the logic device 300 is narrower than the third fin width (W3) of the SRAM device 400 by at least 5%, and the second fin width (W2) of the logic device 300 is narrower than fourth fin width (W4) of the SRAM device 400 by at least by 5%. In some cases, the first fin width (W1) of the logic device 300 is narrower than the third fin width (W3) of the SRAM device 400 by at least 10%. By way of example, active region fin width ratios may also be defined, where for instance W3/W1 is greater than 1.05, and where W4/W2 is greater than 1.05. As noted, the N-type FinFET 310 of the logic device 300 has a first end-cap length 'E1' and the PD transistors (e.g., the PD-1 or the PD-2 transistor) of the SRAM device 400 have a second end-cap length 'E2'. In some embodiments, the second end-cap length 'E2' is longer than first end-cap length 'E1' by at least 10%. In some embodiments, an end-cap length ratio may be defined, where for instance E2/E1 is greater than 1.1. Additionally, as noted above, the CMOS structure of the logic device 300 (e.g., including the P-type FinFET 304 and the N-type FinFET 310) has a first active region space 'S1' between the channel region 318 of the P-type FinFET 304 and the channel region 320 of the N-type FinFET 310 (e.g., between the fin 308 and the fin 314). Further, the CMOS structure of the SRAM device 400 (e.g., such as the N-type FinFET PD-1 and the P-type FinFET PU-1) has a second active region space 'S2' between the PD-channel region and PU-channel region (e.g., such as between the channel region 528 of the N-type FinFET PD-1 and the channel region 530 of the P-type FinFET PU-1). In some embodiments, the first active region space 'S1' is larger than second active region space 'S2' by at least 20%. In addition, in some embodiments and with respect to the unit cell 302 X-pitch Y-pitch 'Y1', and the SRAM unit cell 502 X-pitch 'X2', Y-pitch 'Y2', the X-pitch 'X1' is substantially the same as the X-pitch 'X2'. In some embodiments, the Y-pitch 'Y1' may be substantially the same as, or greater than, the Y-pitch 'Y2'. As such, in various examples, a ratio of the Y-pitches 'Y1TY2' may be equal to 1, 1.5, 2, 2.5, or 3. Also, in some examples, the gate dielectric material and/or thickness (e.g., of the dielectric layer 316A and/or the dielectric layer 522A) of the logic device 300 and the SRAM device 400 is substantially the same.

Referring now to FIGS. 7 and 8, FIG. 7 illustrates an exemplary plan view of a logic device 700, and FIG. 8 provides a cross-sectional view of the logic device 700, along a plane substantially parallel to a plane defined by section EE' of FIG. 7. In some embodiments, the logic device 700 may be used instead of the logic device 300. Thus, in some cases, a semiconductor device (e.g., on a given substrate) may include a plurality of logic devices 700 and a plurality of SRAM devices (e.g., such as the SRAM device 400). In various aspects, the logic device 700 is substantially the same as the logic device 300, discussed above with reference to FIGS. 3 and 4. As such, one or more of the features described above with reference to the logic device 300 may also apply to the logic device 700. Thus, for clarity of discussion, some features of the logic device 700 may be only discussed briefly below.

The logic device 700 may include a CMOS inverter unit cell 702 having the X-pitch 'X1' parallel to a gate routing direction (e.g., parallel to a gate 716) and the Y-pitch 'Y1' parallel to a fin active region routing direction (e.g., parallel to fins 708, 709, 714, 715). In some embodiments, the X-pitch 'X1' is greater than the Y-pitch 'Y1'. For instance, in some cases, the X-pitch 'X1' is about 2 to 3 times greater than the Y-pitch 'Y1'. While shown as including an inverter, the logic device 700 may include a variety of other logic gates, devices, or circuits, as noted above. In some embodiments, the logic device 700 includes a plurality of CMOS devices formed using a double fin N-type FinFET and a double fin P-type FinFET.

For example, the logic device 700 includes a P-type FinFET 704 formed over an N-well region 706 and including double fins (e.g., a fin 708 and a fin 709), and an N-type FinFET 710 formed over a P-well region 712 and including double fins (e.g., a fin 714 and a fin 715). In some embodiments, the X-pitch 'X1' is defined from a left edge of the N-well region 706 to a right edge of the P-well region 712. Fin cut regions 722, 724 identify regions where the fins are cut, for example, to provide isolation to neighboring devices. In some embodiments, the Y-pitch 'Y1' is defined between the fin cut regions 722, 724. The logic device 700 also includes a gate 716 that spans perpendicularly across the double fins of the P-type FinFET 704 and the double fins of the N-type FinFET 710. The gate 716 may include a dielectric layer 716A (e.g., including an interfacial layer and a high-K dielectric layer) formed over channel regions 718 of the double fins of the P-type FinFET 704 and over channel regions 720 of the double fins of the N-type FinFET 710, and a metal layer 716B formed over the dielectric layer 716A. The logic device 700 may also include isolation regions 734, in various embodiments.

In some cases, each of the P-type FinFET 704 and the N-type FinFET 710 include source/drain regions on portions of the double fins adjacent to and on either side of the gate 716, and thus adjacent to and on either side of the channel regions 718, 720. In some examples, a plurality of contacts may be directly (physically) connected to the source/drain regions. For example, the P-type FinFET 704 may include a source contact 726 and a drain contact 728 connected to respective source/drain regions of the P-type FinFET 704. Similarly, the N-type FinFET 710 may include a source contact 730 and a drain contact 732 connected to respective source/drain regions of the N-type FinFET 710. In some embodiments, the X-pitch 'X1' is defined from a left edge of the source contact 726 to a right edge of the source contact 730.

In various embodiments, and with respect to the logic device 700 of FIGS. 7 and 8, it is noted that the double fins of the N-type FinFET 710 (fins 714, 715) each have the first fin width (W1) in the channel regions 720, and the double fins of the P-type FinFET 704 (fins 708, 709) each have the second fin width (W2) in the channel region 718. As discussed above, and with respect to the SRAM device 400 of FIGS. 5 and 6, the PD transistors (e.g., the PD-1 and the PD-2 transistors) have a third fin width (W3), and the PU transistors (e.g., the PU-1 and the PU-2 transistors) have a fourth fin width (W4).

In some embodiments, first fin width (W1) of the logic device 700 is narrower than the third fin width (W3) of the SRAM device 400 by at least 5%, and the second fin width (W2) of the logic device 700 is narrower than fourth fin width (W4) of the SRAM device 400 by at least by 5%. In some cases, the first fin width (W1) of the logic device 700 is narrower than the third fin width (W3) of the SRAM device 400 by at least 10%. By way of example, the active region fin width ratios (e.g., for the logic device 700 and the SRAM device 400) may include W3/W1 is greater than 1.05, and W4/W2 is greater than 1.05. The N-type FinFET 310 of the logic device 700 has the first end-cap length 'E1' and the PD transistors (e.g., the PD-1 or the PD-2 transistor) of the SRAM device 400 have the second end-cap length 'E2'. In some embodiments, the second end-cap length 'E2' is longer than first end-cap length 'E1' by at least 10%. In addition, the CMOS structure of the logic device 700 (e.g., including the P-type FinFET 704 and the N-type FinFET 710) has a first active region space 'S1' between the channel regions 718 of the P-type FinFET 704 and the channel regions 720 of the N-type FinFET 710 (e.g., between the fin 709 and the fin 715). In various examples, the SRAM device 400 has a second active region space 'S2' between the PD-channel region and PU-channel region, as described above. In some embodiments, the first active region space 'S1' is larger than second active region space 'S2' by at least 20%. With respect to the unit cell 702 X-pitch 'X1', Y-pitch 'Y1', and the SRAM unit cell 502 X-pitch 'X2', Y-pitch 'Y2', the X-pitch 'X1' is substantially the same as the X-pitch 'X2'. In some embodiments, the Y-pitch 'Y1' may be substantially the same as, or greater than, the Y-pitch 'Y2'. As such, in various examples, a ratio of the Y-pitches 'Y1TY2' may be equal to 1, 1.5, 2, 2.5, or 3. Also, in some examples, the gate dielectric material and/or thickness (e.g., of the dielectric layer 716A and/or the dielectric layer 522A) of the logic device 700 and the SRAM device 400 is substantially the same.

As a further description of the above disclosure, the fin widths (W1-W4) may be defined within a fin top portion, a fin middle portion, or a fin bottom portion. In addition, the structure of the gate (e.g., such as the gate 316, 518, 520, 522, 524, 716) may include multiple material structures selected from a group such as a poly-gate/SiON structure, a metal(s)/high-K dielectric structure, an Al/refractory metal(s)/high-K dielectric structure, a silicide/high-K dielectric structure, or a combination thereof. In some embodiments, the N-type FinFETs of the logic devices 300, 700 and of the SRAM device 400 may include N-type doped (e.g., phosphorus (P31 or other), As, or both) epitaxially grown source/drain regions. In some embodiments, the logic devices 300, 700 have a first source/drain epi width and the SRAM device 400 has a second epi width, where the second epi width is wider than first epi width by at least 5%. In some embodiments, the P-type FinFETs of the logic devices 300, 700 and of the SRAM device 400 may include P-type doped (e.g., boron, B11 or other) epitaxially grown source/drain regions. In some embodiments, the logic devices 300, 700 have a third S/D epi width and the SRAM device 400 has a fourth epi width, where the fourth epi width is wider than third epi width by at least 5%. In some embodiments, the material of the N-type doped source/drain region includes an epi profile, and the epi material may be selected from a group including SiP, SiC, SiPC, SiAs, Si, or a combination thereof. In some cases, the material of the P-type doped source/drain region includes an epi profile, and the epi material may be selected from a group including SiGe, SiGeC, Ge, or a combination thereof. In some embodiments, the contact layers (e.g., contacting the source/drain regions) may include multiple metal materials that may be selected from a group including Ti, TiN, TaN, Co, W, Al, Ru, Cu, or a combination thereof. In some embodiments, the substrate material of the disclosed devices may be selected from a group including bulk-Si, SiP, SiGe, SiC, SiPC, Ge, SOI-Si, SOI-SiGe, III-VI materials, a combination thereof, or other materials as described above. In some embodiments, the transistors disclosed herein may include FinFET structures selected from a group including a 2D-finFET structure, a 3D-finFET structure, or a combination thereof.

Figure 9:
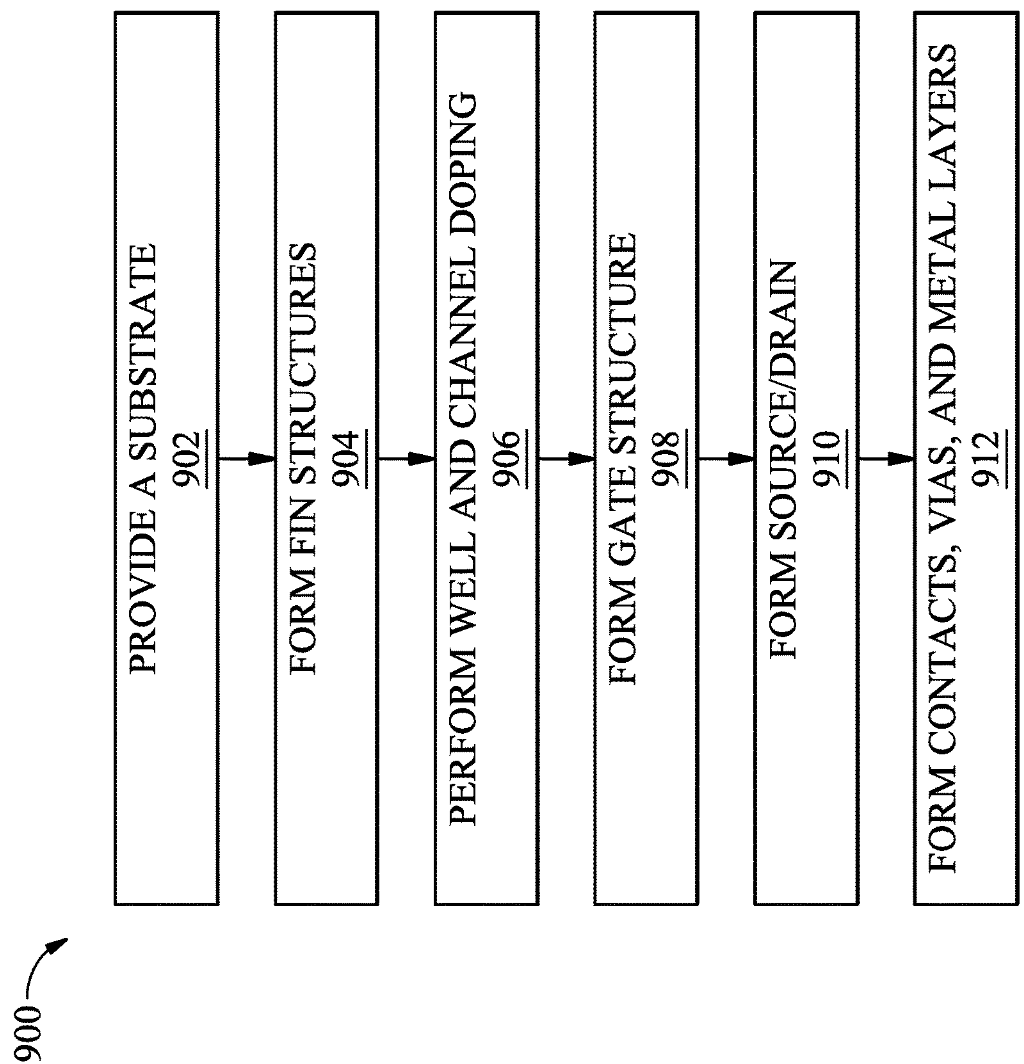
FIG. 9 is an exemplary method 900 of fabricating a semiconductor device, in accordance with one or more embodiments.

Referring now to FIG. 9, illustrated is an exemplary general method 900 of fabricating a semiconductor device (e.g., including one or more of the devices 100, 200, 300, 400, or 700) in accordance with one or more embodiments. It is understood that parts of the method 900 and/or the semiconductor device fabricated thereby may be fabricated by a well-known CMOS technology process flow, and thus some processes are only briefly described herein.

The method 900 begins at block 902 where a substrate (e.g., such as a silicon substrate) is provided. In some examples, the substrate may include a variety of materials and/or configurations, as discussed above with respect to the substrate 102 of FIG. 1. The method 900 proceeds to block 904 where fin structures are formed. In some embodiments, formation of the fin structures includes deposition of a first group of dielectric layers (e.g., having a thickness of between about 100 A-2000 A) on the substrate. Dummy patterns may be formed, where for example, photolithography and etching steps may be used to partially remove the first group of dielectric layers, leaving behind a portion of the first group dielectric layers as well as the dummy patterns. In some embodiments, a second group of dielectric layers is then deposited (e.g., having a thickness of between about 20 A-700 A) and etched back to form at least two spacers on opposing sidewalls of the dummy patterns. In some cases, the dummy patterns are removed (e.g., by a wet etch, a dry etch, or combination thereof) such that the spacers remain. A lithography process may be performed to expose a first fin portion (e.g., a logic device fin portion or an SRAM device fin portion), and an extra etch process may be performed for spacer layer CD trim down. In some embodiments, the remaining spacer layers may be used as a hard mask to partially remove the Si substrate. In some cases, another lithography and etch process (e.g., cut layer process) may be performed to remove unnecessary fin region(s). After formation of the fin lines, the method 900 proceeds to block 906 where well and channel doping may be performed. Thereafter, the method 900 proceeds to block 908 where a gate structure is formed. By way of example, the gate structure may include one or more of the gate structures discussed above (e.g., including a gate dielectric layer and a metal layer over the gate dielectric layer). The method 900 then proceeds to block 910 where device source/drain regions are formed, such as the source/drain regions discussed above. The method 900 then proceeds to block 912 where and contacts, VIAs, and metal interconnect layers may be formed. In some embodiments, the method 900 may continue with further processing to form various features and regions known in the art.

Thus, the various embodiments described herein offer several advantages over the existing art. It will be understood that not all advantages have been necessarily discussed herein, no particular advantage is required for all embodiments, and other embodiments may offer different advantages. For example, embodiments discussed herein include structures and methods for the co-optimization of core (logic) devices and SRAM devices. In various embodiments, a semiconductor device may include individual device structures to meet both logic device requirements and SRAM requirements. In some cases, logic transistors may have a narrow fin CD for Ion/Ioff ratio improvement, and SRAM devices may have a thicker fin CD (e.g., compared to the logic devices) to avoid latch-up (e.g., by providing improved well resistance and N+PW/NW, P+/NW/PW isolation leakage improvement). In some examples, logic transistors may have a shorter gate electrode end-cap for contact-to-gate capacitance reduction, and SRAM devices may have a longer gate electrode end-cap for Vt stability improvement and Vcc_min reduction. In some embodiments, logic transistors may have wider well isolation space rules (e.g., N+ OD to N_Well, P+OD to P_well) for latch-up and well isolation leakage improvement, and SRAM devices may push (reduce) narrow well isolation space rules (e.g., N+ OD to N_Well, P+OD to P_Well) for cell size reduction. Generally, the various embodiments disclosed herein provide for the simultaneous optimization of logic device performance, SRAM cell scaling, and manufacturing process margin. Additional embodiments and advantages will be evident to those skilled in the art in possession of this disclosure.

Thus, one of the embodiments of the present disclosure described a semiconductor device including a logic portion and a memory portion. In some embodiments, a logic device is disposed within the logic portion. In some cases, the logic device includes a single fin N-type FinFET and a single fin P-type FinFET. In some examples, a static random-access memory (SRAM) device is disposed within the memory portion. The SRAM device includes an N-well region disposed between two P-well regions, where the two P-well regions include an N-type FinFET pass gate (PG) transistor and an N-type FinFET pull-down (PD) transistor, and where the N-well region includes a P-type FinFET pull-up (PU) transistor.

In another of the embodiments, discussed is a circuit including a first circuit region and a second circuit region. In some embodiments, a logic circuit is disposed within the first circuit region. In some cases, the logic circuit includes a double fin N-type FinFET and a double fin P-type FinFET. In various embodiments, a memory circuit is disposed within the second circuit region. In some examples, the memory circuit includes a first plurality of single fin N-type FinFETs and a second plurality of single fin P-type FinFETs.

In yet another of the embodiments, discussed is a semiconductor device including a plurality of logic portions and a plurality of memory portions disposed on a substrate. In some examples, a plurality of CMOS devices is disposed within the plurality of logic portions, where each CMOS device includes a single fin N-type FinFET having a first fin width (W1) and a single fin P-type FinFET having a second fin width (W2). In some embodiments, a plurality of static random-access memory (SRAM) devices is disposed within the plurality of memory portions, where the plurality of SRAM devices are arranged in a plurality of rows and columns. In some cases, each SRAM device includes an N-type FinFET pass gate (PG) transistor and an N-type FinFET pull-down (PD) transistor disposed within a P-well region and a P-type FinFET pull-up (PU) transistor disposed within an N-well region. In some embodiments, the N-type FinFET PD transistor has a third fin width (W3) and the P-type FinFET PU transistor has a fourth fin width (W4). In various examples, the first fin width (W1) is narrower than the third fin width (W3).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a logic portion and a memory portion;

a logic device disposed within the logic portion, wherein the logic device includes a single fin N-type FinFET and a single fin P-type FinFET; and a static random-access memory (SRAM) device disposed within the memory portion, wherein the SRAM device includes an N-well region disposed between two P-well regions, wherein the two P-well regions include an N-type FinFET pass gate (PG) transistor and an N-type FinFET pull-down (PD) transistor, and wherein the N-well region includes a P-type FinFET pull-up (PU) transistor;

wherein a first gate formed over the single fin N-type FinFET has a first end-cap length 'E1', and wherein a second gate formed over the N-type FinFET PD transistor has a second end-cap length 'E2'.

2. The semiconductor device of claim 1, wherein the logic device includes an inverter, an AND gate, a NAND gate, an OR gate, a NOR gate, a flip-flop, scan logic, or combinational logic.

3. The semiconductor device of claim 1, wherein the logic device has a first active region space 'S1' between a channel region of the single fin N-type FinFET and a channel region of the single fin P-type FinFET, and wherein the SRAM device has a second active region space 'S2' between a PD-channel region and a PU-channel region.

4. The semiconductor device of claim 3, wherein the first active region space 'S1' is larger than the second active region space 'S2' by at least 20%.

5. The semiconductor device of claim 1, wherein the second end-cap length 'E2' is longer than the first end-cap length 'E1' by at least 10%.

6. The semiconductor device of claim 1, wherein an end-cap length ratio E2/E1 is greater than 1.1.

7. The semiconductor device of claim 1, wherein the logic device includes a first unit cell having a first X-pitch 'X1' and a first Y-pitch 'Y1', wherein the SRAM device includes a second unit cell having a second X-pitch 'X2' and a second Y-pitch 'Y2', and wherein the first X-pitch 'X1' is the same as the second X-pitch 'X2'.

8. The semiconductor device of claim 1, wherein the N-type FinFET PG transistor and the N-type FinFET PD transistor include a single fin N-type FinFET, and wherein the P-type FinFET PU transistor includes a single fin P-type FinFET.

9. The semiconductor device of claim 1, wherein the single fin N-type FinFET has first fin width (W1) in a first channel region, wherein the single fin P-type FinFET has second fin width (W2) in a second channel region, wherein the N-type FinFET PD transistor has a third fin width (W3) in a third channel region, and wherein the P-type FinFET PU transistor has a fourth fin width (W4) in a fourth channel region.

10. The semiconductor device of claim 9, wherein the first fin width (W1) is narrower than the third fin width (W3) by at least 5%, and wherein the second fin width (W2) is narrower than the fourth fin width (W4) by at least by 5%.

11. The semiconductor device of claim 9, wherein a first fin width ratio W3/W1 is greater than 1.05, and wherein a second fin width ratio W4/W2 is greater than 1.05.

12. A circuit, comprising:

a first circuit region and a second circuit region;

a logic circuit disposed within the first circuit region, wherein the logic circuit includes a double fin N-type FinFET and a double fin P-type FinFET; and a memory circuit disposed within the second circuit region, wherein the memory circuit includes a first plurality of single fin N-type FinFETs and a second plurality of single fin P-type FinFETs;

wherein the logic circuit includes a first unit cell having a first X-pitch 'X1', wherein the memory circuit includes a second unit cell having a second X-pitch 'X2', and wherein the first X-pitch 'X1' is the same as the second X-pitch 'X2'.

13. The circuit of claim 12, wherein the memory circuit includes a plurality of static random-access memory (SRAM) unit cells arranged in a plurality of columns and rows.

14. The circuit of claim 13, wherein each SRAM unit cell of the plurality of SRAM unit cells includes an N-well region disposed between two P-well regions, wherein the two P-well regions include an N-type FinFET pass gate (PG) transistor and an N-type FinFET pull-down (PD) transistor, and wherein the N-well region includes a P-type FinFET pull-up (PU) transistor.

15. The circuit of claim 12, wherein the logic circuit has a first active region space 'S1' between a channel region of the double fin N-type FinFET and a channel region of the double fin P-type FinFET, wherein an SRAM device of the memory circuit has a second active region space 'S2' between a PD-channel region and a PU-channel region, and wherein the first active region space 'S1' is larger than the second active region space 'S2' by at least 20%.

16. The circuit of claim 12, wherein a first gate formed over the double fin N-type FinFET has a first end-cap length 'E1', wherein a second gate formed over an N-type FinFET PD transistor of the memory circuit has a second end-cap length 'E2', and wherein the second end-cap length 'E2' is longer than the first end-cap length 'E1' by at least 10%.

17. The circuit of claim 14, wherein the double fin N-type FinFET has a first fin width (W1) in a first channel region, wherein the N-type FinFET PD transistor has a third fin width (W3) in a third channel region, and wherein the first fin width (W1) is narrower than the third fin width (W3) by at least 10%.

18. A semiconductor device, comprising:

a plurality of logic portions and a plurality of memory portions disposed on a substrate;

a plurality of CMOS devices disposed within the plurality of logic portions, wherein each CMOS device includes a single fin N-type FinFET having a first fin width (W1) and a single fin P-type FinFET having a second fin width (W2); and a plurality of static random-access memory (SRAM) devices disposed within the plurality of memory portions, wherein the plurality of SRAM devices are arranged in a plurality of rows and columns, wherein each SRAM device includes an N-type FinFET pass gate (PG) transistor and an N-type FinFET pull-down (PD) transistor disposed within a P-well region and a P-type FinFET pull-up (PU) transistor disposed within an N-well region, wherein the N-type FinFET PD transistor has a third fin width (W3), wherein the P-type FinFET PU transistor has a fourth fin width (W4) and wherein the first fin width (W1) is narrower than the third fin width (W3);

wherein a first gate formed over the single fin N-type FinFET has a first end-cap length 'E1', wherein the first gate includes a metal gate layer, and wherein the first end-cap length 'E1' is at least two times greater than a thickness of the metal gate layer.

19. The semiconductor device of claim 18, wherein each CMOS device has a first active region space 'S1' between a channel region of the single fin N-type FinFET and a channel region of the single fin P-type FinFET, wherein each SRAM device has a second active region space 'S2' between a PD-channel region and a PU-channel region, wherein the first active region space 'S1' is larger than the second active region space 'S2' by at least 20%; and wherein a second gate formed over the N-type FinFET PD transistor has a second end-cap length 'E2', and wherein the second end-cap length 'E2' is longer than the first end-cap length 'E1' by at least 10%.

20. The semiconductor device of claim 1, wherein the logic device includes a first epitaxial source/drain region having a first source/drain epitaxial width, and wherein the SRAM device includes a second epitaxial source/drain region having a second source/drain epitaxial width greater than the first source/drain epitaxial width.

* * * * *